United States Patent [19]

Fedeli et al.

[11] Patent Number: 4,720,814
[45] Date of Patent: Jan. 19, 1988

[54] MAGNETIC BUBBLE GENERATOR FOR BUBBLE MEMORY IN HYBRID TECHNOLOGY

[75] Inventors: Jean-Marc Fedeli, Le Fontanil; Christine Louis, Saint Egreve; Christian Pisella, Rives/Fure, all of France

[73] Assignee: Commissariat a l'Energie Atomique, France

[21] Appl. No.: 863,141

[22] Filed: May 14, 1986

[30] Foreign Application Priority Data

May 21, 1985 [FR] France .................... 85 07620

[51] Int. Cl.$^4$ .............................. G11C 19/08
[52] U.S. Cl. ................................ 365/11; 365/36
[58] Field of Search ..................... 365/11, 36

[56] References Cited

U.S. PATENT DOCUMENTS

| | | | |
|---|---|---|---|
| 3,967,002 | 6/1976 | Almasi et al. | 365/36 |
| 4,086,571 | 4/1978 | Bullock | 365/11 |
| 4,128,895 | 12/1978 | Almasi et al. | 365/11 |
| 4,525,807 | 6/1985 | Jouve | 365/11 |

FOREIGN PATENT DOCUMENTS 0171690  9/1985  Japan ........................ 365/11

OTHER PUBLICATIONS

IEEE Transactions on Magnetics (Sep. 1973), vol. MAG-9, No. 3, pp. 289-293.
IEEE International Solid State Circuits Conference (Feb. 14, 1980), New York, pp. 112-113.

*Primary Examiner*—James W. Moffitt

[57] ABSTRACT

The bubble memory comprises a magnetic layer in which the magnetic bubble can move under the action of a rotary field, a deposited pattern formed from a high permeability magnetic material and separated from the magnetic layer by an electrical insulating layer, a U-shaped electric conductor placed between the magnetic layer and the deposited pattern and electrically insulated therefrom, the deposited pattern covering the base of the internal space defined by the electric conductor and thus defining a nucleation position. The generator also comprises an implanted pattern produced in a fraction of the thickness of the magnetic layer, the implanted pattern at least covering the nucleation position.

6 Claims, 5 Drawing Figures

MAGNETIC BUBBLE GENERATOR FOR BUBBLE MEMORY IN HYBRID TECHNOLOGY

BACKGROUND OF THE INVENTION

The present invention relates to a magnetic bubble generator for a bubble memory in hybrid technology, i.e. having soft or deposited patterns, e.g. of permalloy or FeNi and nonimplanted patterns.

In a magnetic bubble memory, the magnetic bubbles are contained in a monocrystalline magnetic layer, such as a magnetic garnet film, supported by an amagnetic monocrystalline garnet. These bubbles are in the form of generally cylindrical, isolated magnetic domains having a magnetization which is the reverse of that of the remainder of the monocrystalline magnetic layer. These magnetic bubbles are stable by applying a continuous magnetic field $H_p$ perpendicular to the plane of the magnetic layer. In practice, this magnetic field is produced by a permanent magnet, thus ensuring the nonvolatility of the informations contained in the bubble memory.

In a magnetic bubble memory, the displacement of the bubbles is brought about by applying a rotary continuous or d.c. field $H_T$ in a direction parallel to the magnetic layer surface. The bubbles are displaced around the so-called propagation patterns.

These patterns are in the form of discs, lozenges, triangles, T's, etc. and can be produced from an iron and nickel-based material, deposited on an insulating layer covering the magnetic layer, or can be obtained by implanting ions in the upper part of the magnetic layer through a mask making it possible to define the shape of said patterns. In the latter case, in view of the fact that ion implantation only takes place around the patterns, the latter are called non-implanted patterns. The propagation patterns are generally contiguous, due to their shape, two adjacent patterns defining between them two cavities.

The displacement of the bubbles along these patterns generally takes place for a time equal to one third of the rotation period of the planar magnetic field $H_T$, the bubbles remaining stationary in the cavities defined between two adjacent patterns during the remainder of the cycle. These cavities constitute so-called stable positions. Thus, shift registers are produced in which the binary information "1" is represented by the presence of a bubble and the binary information "0" by the absence of a bubble.

Apart from these propagation patterns, it is necessary to use electric conductors for producing in the bubble memory writing, information recording, non-destructive reading, register to register transfer and clearing functions. One of the main types of known magnetic bubble memory comprises a group of loops or registers of the so-called minor type used for storing information, associated with one or two loops or registers of the so-called major type constituting the memory access stations. The minor loops are arranged in a longitudinally juxtaposed manner and the major loops are oriented perpendicular to the minor loops. The magnetic bubbles in the minor loops can be transferred into the major loops and vice versa via unidirectional or bidirectional transfer gates.

When a single major loop is used, the information reading and writing takes place by means of this single loop. In this first case, reference is made to a memory having a major-minor organization. Conversely, when use is made of two major loops, the writing of the information takes place via one of these two loops and the reading of the information via the other loop. These major loops are generally located on either side of minor loops. In this latter case (two loops), reference is generally made to a memory having a series-parallel organization.

A bubble memory comprises three modules, namely a writing module, a storage module and a reading module.

The writing module comprises a bubble generator, a major writing loop and exchange gates for transferring magnetic bubbles from the major writing loop to the minor loops. The storage module comprises a group of minor loops on which are stored the bubbles. The reading module comprises a major reading loop, a group of duplication gates for copying again the magnetic bubbles of the minor loops on the major reading loop, as well as a detection means.

In a magnetic bubble memory in hybrid technology, the writing and reading modules are produced with deposited or soft patterns and the storage module with a non-implanted pattern, so as to permit a maximum information storage density.

According to the prior art, the only patterns used in a magnetic bubble generator in a hybrid technology bubble memory are deposited patterns. FIG. 1 shows an embodiment of a known bubble generator. This bubble generator 2 comprises an electric conductor 5 and a deposited pattern 6. The generally U-shaped electric conductor 5 is deposited on an electrically insulating layer covering the magnetic layer in which travel the bubbles. The deposited pattern 6 is produced on an electrically insulating layer covering the electric conductor 4.

The bubble generation or nucleation position is defined by that part of the internal space of the electric conductor 4 located in the vicinity of one edge of the deposited pattern 6. The latter has a shape serving to produce a strong magnetic pole on said edge.

When a current flows through the electric conductor 4, a magnetic field is produced in its internal space, which locally produces within the magnetic layer a magnetic domain. For a given direction of the electric current passing through the electric conductor 4, the magnetic domain produces a magnetization which is the opposite to that of the magnetic layer, so that said magnetization domain constitutes a magnetic bubble.

The current pulse emitted in the electric conductor 4 must be synchronized with the rotary field $H_T$. In FIG. 1, the current pulse must be emitted at the time of the phase 1 of the rotary field $H_T$. Thus, the bubble is produced in position $a_1$ and then moves with the rotary field $H_T$ into positions $a_2$, $a_3$. At the following time, it crosses the gap between the deposited pattern 6 and a deposited pattern 8 of the major writing loop.

The electric insulating layer separating electric conductor 4 from the magnetic layer containing the bubbles must have an adequate thickness so as not to induce mechanical stresses from conductor 4 on the magnetic layer. However, the greater the thickness of said layer, the more intense must be the nucleation current.

Thus, the choice of the thickness of this electrical insulating layer is a compromise between opposing parameters. Generally a thickness of approximately 100 nm is chosen, which fixes the nucleation current intensity at approximately 200 mA. This thickness is small and can lead to mechanical stress problems.

However, the necessary nucleation current intensity is high for nucleating bubbles at low temperature. However, it is known that the necessary nucleation current increases in proportion to the memory temperature. As the nucleation current is not adjusted as a function of the temperature, but is maintained constant, said nucleation current is generally too high when the memory temperature exceeds approximately 80° C. It is then commonplace for the nucleating magnetic bubble to extend in the internal space along the axis of the electric conductor and splits into two magnetic bubbles when the rotary field $H_T$ passes from phase 1 to phase 2, which produces random errors in the memory.

The magnetic bubble generator shown in FIG. 1 illustrates the conventional structure of a magnetic bubble generator in a memory having deposited patterns or in a hybrid technology memory. In a memory with non-implanted patterns, the structure of the bubble generator is similar to that of the bubble generator of FIG. 1, the only difference being the replacement of the deposited patterns by non-implanted patterns. FIG. 2 illustrates an embodiment of a magnetic bubble generator in a memory with non-implanted patterns.

The major reading loop comprises a sequence of contiguous non-implanted patterns 10, the junction between two successive non-implanted patterns defining a stable position for the magnetic bubbles. A U-shaped electric conductor 4 is arranged perpendicular to the major writing loop axis. The axis of this electric conductor coincides with the junction axis between two consecutive non-implanted patterns. The nucleation position is defined by the base of the internal space of electric conductor 4, said position being a stable position of the propagation path on the major loop.

The magnetic bubble generator of FIG. 2 functions in the same way as the generator of FIG. 1. The nucleation current is emitted into electric conductor 4 in relation with the phase of the rotary field $H_T$. In the present embodiment, this nucleation current is emitted during phase 3 of the rotary field.

The intensity of the nucleation current is approximately 150 mA, when the electrically insulating layer placed between the magnetic layer and the electric conductor has a thickness of approximately 100 nm.

SUMMARY OF THE INVENTION

The object of the present invention is to obviate the disadvantages of the known magnetic bubble generators for hybrid technology bubble memories. The invention consists of adding to the generator an implanted zone located at least within the nucleation position. This makes it possible to produce below said implanted zone a reduction in the forces opposing the reversal of the magnetization. Experience shows that in this way it is possible to reduce the amplitude of the nucleation current to a significant extent.

Specifically, the present invention relates to a magnetic bubble generator for a bubble memory in hybrid technology comprising a magnetic layer in which a magnetic bubble can move under the action of a rotary field, a deposited pattern constituted by a high permeability magnetic material and separated from the magnetic layer by an electric insulating layer, a U-shaped electric conductor placed between said magnetic layer and the deposited pattern and electrically insulated therefrom, the deposited pattern covering the base of the internal space defined by the electric conductor, the portion simultaneously covered by said deposited pattern and the internal space of the electric conductor constituting a nucleation position, wherein the generator comprises an implanted pattern, produced in a fraction of the thickness of the magnetic layer, said implanted pattern at least covering the nucleation position.

Preferably, the boundaries of the implanted pattern are, in the internal space of the electric conductor, in the vicinity of the nucleation position. This makes it possible to limit the extension, in the electric conductor axis, of the bubble produced, thereby preventing the simultaneous nucleation of several bubbles.

In a preferred manner, the electric conductor axis is parallel to an easy magnetization axis of the magnetic layer. Such a structure has the advantage of making the nucleation position more stable.

The implanted zone can extend to a greater or lesser extent in the propagation direction of the bubble produced. According to a first preferred embodiment, the boundary of the implanted pattern, crossed by the bubble produced in its progression along the edge of the deposited pattern, is located in the vicinity of the nucleation position. The nucleation of the bubble and the crossing of the implanted zone-non-implanted zone boundary are then brought about simultaneously.

According to a secondary feature, the implanted pattern has essentially the shape of a trapezium, whose bases have a direction substantially perpendicular to the electric conductor axis, the small base being closer to the nucleation position.

According to a second preferred embodiment, the implanted pattern and the deposited pattern partly overlap in the propagation direction of the bubble produced, up to a stable position of the bubble on the deposited pattern.

In such a generator, the stages of generating the bubble and crossing the implanted zone-non-implanted zone boundary are separated in time.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
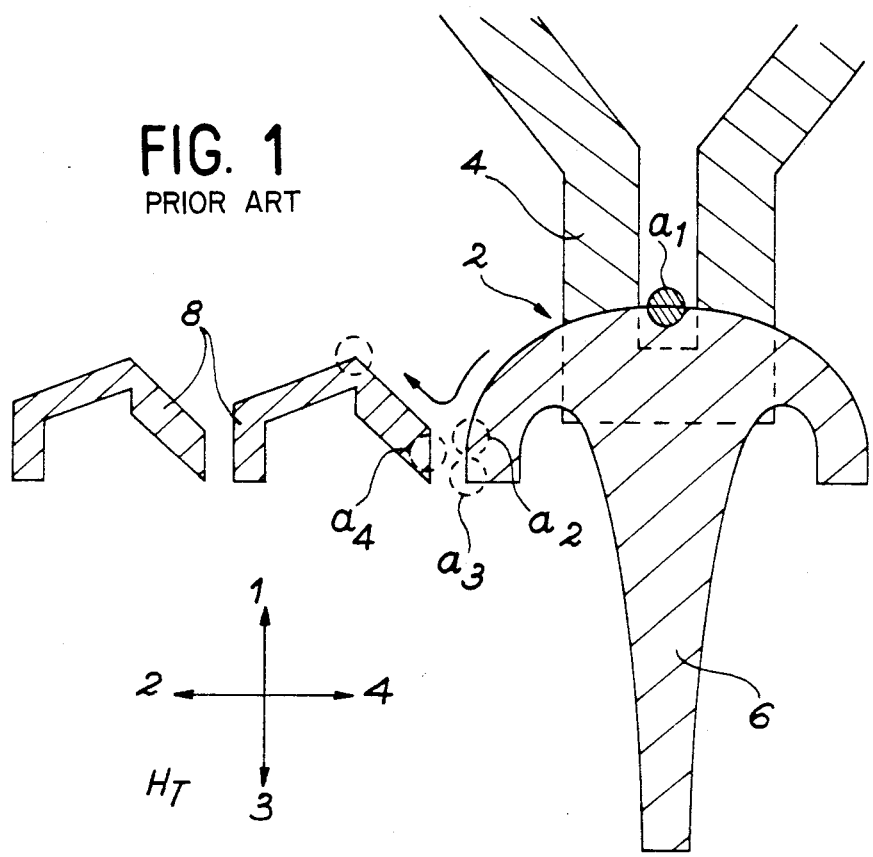
FIG. 1, already described, a known magnetic bubble generator for a magnetic bubble memory with deposited patterns or in hybrid technology.
Figure 2:
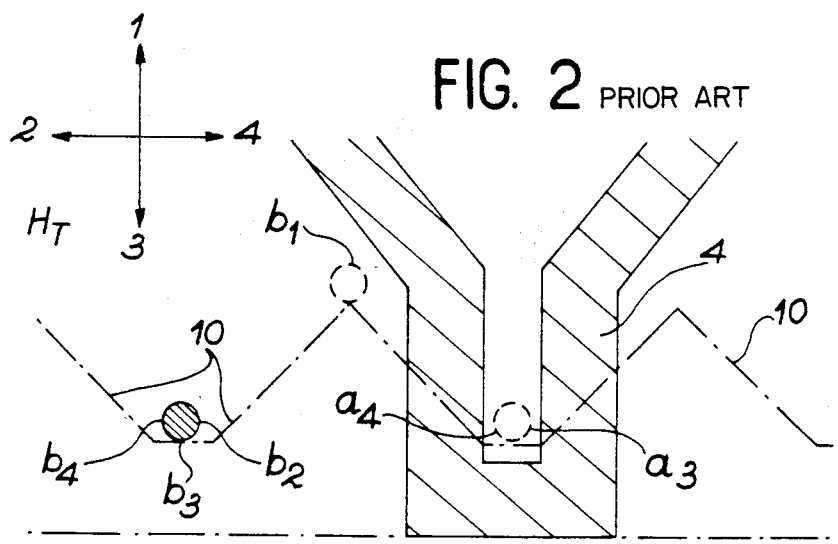
FIG. 2, already described, a known magnetic bubble generator for a magnetic bubble memory with non-implanted patterns.
Figure 3:
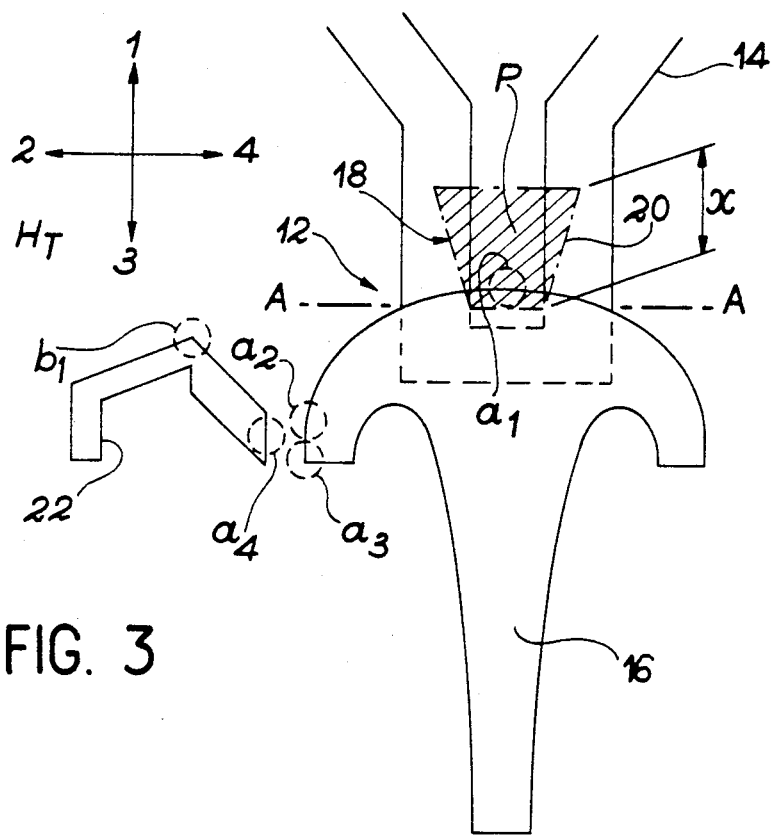
FIG. 3, a first embodiment of a magnetic bubble generator according to the invention for a hybrid technology pattern.

FIG. 3 shows a first embodiment of a magnetic bubble generator according to the invention. Generator 12 comprises in per se known manner a U-shaped electric conductor 5 and a deposited pattern 6. In per se known manner, these two elements define a nucleation position P located on the edge of the deposited pattern 16 in the internal space of electric conductor 14. The magnetic bubble generator 12 also comprises, according to the present invention, an implanted zone 18, which at least covers the nucleation position P.

Figure 4:
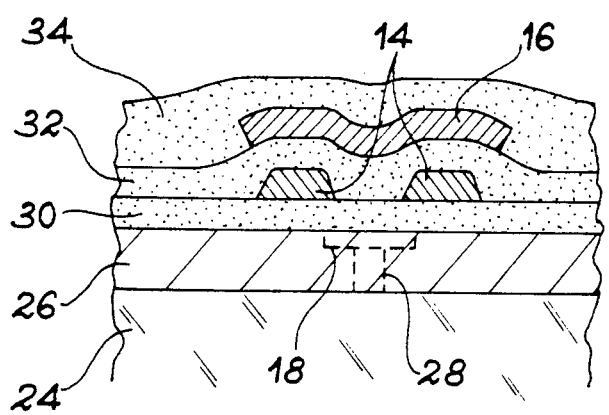
FIG. 4, a sectional view along axis AA of the generator of FIG. 3.

The sectional view along AA shown in FIG. 4 illustrates the different technological layers constituting the magnetic bubble generator according to the invention. On an amagnetic substrate 24, said generator comprises a magnetic layer 26 obtained by epitaxy. This layer constitutes the domain of the magnetic bubbles such as 28. In the upper part of magnetic layer 26, e.g. in the upper third, ion implantation produces implanted patterns, such as implanted pattern 18. This magnetic layer is covered with an electrically insulating layer 30, e.g. of $SiO_2$. On the latter layer is deposited an electrically conductive layer, e.g. of Au, in which is etched the electric conductor 14. An electrically insulating layer 32, e.g. of $SiO_2$ is then deposited. On the latter is produced the deposited pattern 16, e.g. constituted by permalloy or FeNi. The production of the generator is completed by a final passivation layer 34, e.g. of $SiO_2$.

It should be noted that in this diagrammatic section, the relative thicknesses of the layers have not been respected. The amagnetic layer 24 has a thickness of approximately 500 μm, the magnetic layer 26 a thickness of approximately 1 μm and the electrically insulating layer 30 a thickness of approximately 100 nm.

On returning to FIG. 3, the implanted zone 18 of generator 12 produces in the zone of the nucleation position P, a reduction in the magnetic forces opposing the reversal of the magnetization in magnetic layer 26, i.e. the production of a magnetic bubble. Experience shows that it is possible in this way to reduce the amplitude of the nucleation current by a factor of approximately 2 to 3 compared with the nucleation current used in the prior art. Compared with the latter, this makes it possible to increase the thickness of the electrical insulating layer 30.

The nucleation of a magnetic bubble in the nucleation position P is made easier as the deposited pattern 16 produces an intense magnetic pole in the vicinity of the nucleation position. This is carried out in conventional manner by using a deposited pattern 16 with a significant length along the axis of electric conductor 14. The nucleation can be facilitated in known manner by placing the electric conductor in such a way that its axis is parallel to an easy magnetization axis for magnetic layer 26. Finally, the implanted zone 18 also aids the nucleation of a magnetic bubble.

For example, FIG. 3 shows a trapezoidal implanted zone 18, although this shape is not the only shape possible. However, in preferred manner, the implanted zone 18 has a shape such that its extension X into the internal space defined by electric conductor 14 and along the axis of said conductor remains limited to a length of a few magnetic bubble diameters. Thus, a magnetic bubble remaining at the time of its nucleation in the space defined by the intersection between implanted zone 18 and the internal space of electric conductor 14, said special shape of implanted zone 18 makes it possible to limit the extension of the nucleated bubble into the internal space of conductor 14 and thus eliminates any possibility of double nucleation.

The boundary 20 of implanted zone 18, located in front of the nucleation position P with respect to the propagation direction of the magnetic bubbles on the edge of deposited pattern 16 is also preferably located in the vicinity of the internal space of conductor 14.

References $a_1, a_2, a_3, a_4, b_1, \ldots$ indicate the successive positions of a magnetic bubble moving under the action of the rotary field $H_T$. The number in these references indicates the phase of the rotary field $H_T$. A magnetic bubble is produced in nucleation position P by applying a nucleation position to electric conductor 14 during phase 1 of rotary field $H_T$. This nucleation current has an intensity of approximately 50 mA.

In the generator of FIG. 3, the bubble produced immediately crosses the boundary between the implanted zone and the non-implanted zone. It moves along the edge of the deposited pattern 16 and, between phases 3 and 4 of rotary field $H_T$, crosses the space between the deposited pattern 16 and the first deposited pattern 22 of the major writing loop.

Figure 5:
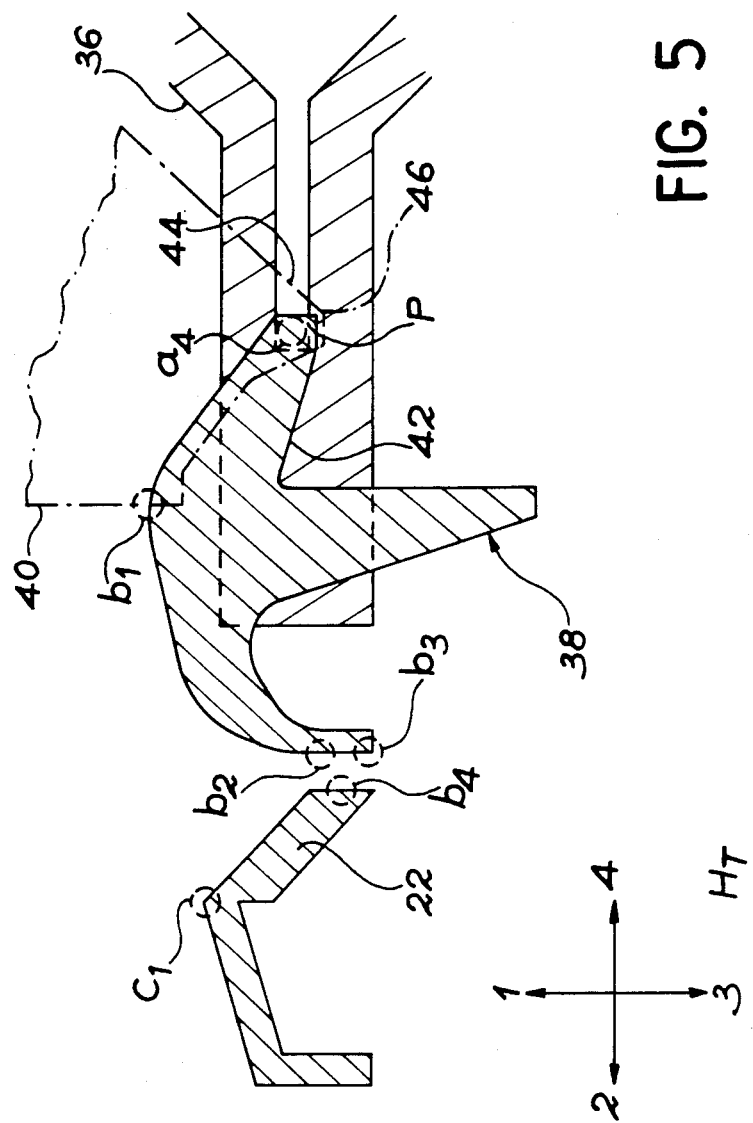
FIG. 5, a second embodiment of a magnetic bubble generator according to the invention for a memory in hybrid technology.

FIG. 5 shows a second embodiment of the magnetic bubble generator according to the invention, in which the stages of producing the magnetic bubble and the transfer of said bubble out of the implanted zone are separated. This leads to an improvement in the generator reliability.

The generator shown in FIG. 5 has a U-shaped electric conductor 36, a deposited pattern 38 and an implanted zone 40. One end of the deposited pattern 38 is located in conventional manner in the vicinity of the base of the inner space of electric conductor 36, thus defining the nucleation position P. According to the invention, the implanted zone 40 is positioned so as to at least cover the nucleation position P.

In order to separate the stages of producing and transferring the bubble produced out of the implanted zone, the latter is extended over a significant distance along the propagation path of the bubble from nucleation position P. This implanted zone 40 is e.g. extended at least up to the first stable position of the propagation path on the deposited pattern 38.

As in the embodiment of the generator shown in FIG. 3, the nucleation of a magnetic bubble is aided by the form of the deposited pattern 38 and that of the implanted zone 40. In particular, the intensity of the magnetic pole produced by the deposited pattern 38 is increased by the elongated shape of branch 42 of said deposited pattern, whose end coincides with nucleation position P. In the same way, the axis of the electric conductor is preferably parallel to an easy magnetization axis of the magnetic layer.

The extension of the implanted zone into the internal space defined by the electric conductor 36 is limited. The boundary 44 of the implanted zone in said internal space remains in the vicinity of the nucleation position P, e.g. at a distance of a few magnetic bubble diameters, which makes it possible to prevent double nucleations. The boundary 46 of the implanted zone located before the nucleation position P, with respect to the propagation direction of a magnetic bubble along the deposited pattern 38, is also preferably in the vicinity of the nucleation position P.

References $a_4, b_1, b_2, b_3, b_4, c_1, \ldots$ indicate the successive positions of a magnetic bubble as a function of the phase of the rotary field $H_T$, the numerical reference indicating the phase of the field. In the generator of FIG. 5, a magnetic bubble is produced when the rotary field $H_T$ is in phase 4 by applying a nucleation current to the electric conductor 36. The nucleation current intensity is approximately 50 mA. Between phases 4 and 1 of rotary field $H_T$, the magnetic bubble produced moves following the edge of the deposited pattern 38 up to the stable position $b_1$, where it crosses the boundary of the implanted zone. The magnetic bubble then continues to move along the edge of the deposited pattern 38 and is transferreed, between phases 3 and 4 of rotary field $H_T$, from the deposited pattern 38 to the first deposited pattern 22 of the major writing loop.

What is claimed is:

1. A magnetic bubble generator for a bubble memory in hybrid technology comprising a magnetic layer in which a magnetic bubble can move under the action of a rotary field, a deposited pattern constituted by a high permeability magnetic material and separated from the magnetic layer by an electric insulating layer, a U-shaped electric conductor placed between said magnetic layer and the deposited pattern and electrically insulated therefrom, the deposited pattern covering the base of the internal space defined by the electric conductor, the portion simultaneously covered by said deposited pattern and the internal space of the electric conductor constituting a nucleation position, wherein the generator comprises an implanted pattern, produced in a fraction of the thickness of the magnetic layer, said implanted pattern at least covering the nucleation position.

2. A magnetic bubble generator according to claim 1, wherein the boundaries of the implanted pattern in the internal space of the electric conductor are in the vicinity of the nucleation position.

3. A magnetic bubble generator according to claim 1, wherein the axis of the electric conductor is parallel to an easy magnetization axis of the magnetic layer.

4. A magnetic bubble generator according to claim 2, wherein the boundary of the implanted pattern, crossed by the bubble produced in its propagation along the boundary of the deposited pattern is located in the vicinity of the nucleation position.

5. A magnetic bubble generator according to claim 4, wherein the implanted pattern is essentially shaped like a trapezium, whose bases have a direction substantially perpendicular to the axis of the electric conductor, the small base being closest to the nucleation position.

6. A magnetic bubble generator according to claim 2, wherein the implanted pattern and the deposited pattern partly overlap, in the advance direction of the bubble produced, up to a stable position of the bubble on the deposited pattern.

* * * * *